United States Patent [19]

Phillips

[11] 4,155,055

[45] May 15, 1979

[54] WAVE DEVICE HAVING A REVERSE DOMAIN GRATING

[75] Inventor: William Phillips, Princeton, N.J.

[73] Assignee: RCA Corporation, New York, N.Y.

[21] Appl. No.: 863,905

[22] Filed: Dec. 23, 1977

[51] Int. Cl.² .................. H03H 9/04; H03H 9/30; H03H 9/20; H01L 41/22
[52] U.S. Cl. .................................. 333/153; 310/313; 333/195; 361/233; 427/100; 252/62.9
[58] Field of Search ............... 333/30 R, 72, 71; 310/313; 331/107 A; 361/233; 350/96.12, 96.19, 96.34, 106, 109, 321; 29/25.35, 594; 252/62.3 R, 62.9 R; 427/250, 255, 162-164, 248 R, 380, 248 A, 248 E, 100, 343, 430 R, 430 B, 430 A

[56] References Cited

U.S. PATENT DOCUMENTS

| | | | |
|---|---|---|---|
| 3,310,720 | 3/1967 | King et al. | 361/233 |
| 4,037,005 | 7/1977 | Phillips | 427/162 |
| 4,073,675 | 2/1978 | Ballman et al. | 427/162 X |

OTHER PUBLICATIONS

Dakss et al.—"Generation of Surface Wave Networks by Optical Damage" in IBM Technical Disclosure Bulletin, vol. 12, No. 11, Apr. 1970; pp. 1942-1943.

*Primary Examiner*—Alfred E. Smith
*Assistant Examiner*—Marvin Nussbaum
*Attorney, Agent, or Firm*—H. Christoffersen; B. E. Morris; William J. Burke

[57] ABSTRACT

This invention relates to a wave device comprising a single domain lithium niobate substrate having thereon a grating wherein the grating comprises single domain regions of lithium niobate having their plus c-axis direction substantially opposite the plus c-axis direction of the substrate.

7 Claims, 2 Drawing Figures

WAVE DEVICE HAVING A REVERSE DOMAIN GRATING

CROSS REFERENCES TO RELATED APPLICATION

This invention is related to copending application "A Surface Acoustic Wave Device With Reduced Spurious Response", of William Phillips, Ser. No. 854,203, filed Nov. 23, 1977, herein incorporated by reference.

BACKGROUND OF THE INVENTION

Gratings on wave devices such as surface acoustic wave devices and optical wave devices have a multitude of uses. For example, optical wave devices with gratings may be used as beam splitters or coupling devices. Surface acoustic wave devices with gratings and electrode patterns may be utilized as wave launchers and receivers. Commonly the gratings are indentations in the wave device surface formed by employing standard lithographic and etching techniques. Because of the wide use of these devices new gratings have been sought which reduce power losses or increase efficiency as they operate on waves and which have improved economics of manufacturing.

SUMMARY OF THE INVENTION

A wave device is comprised of a single domain lithium niobate substrate having thereon a grating of single domain regions of lithium niobate whose plus c-axis direction is substantially opposite the plus c-axis direction of the substrate. These gratings may be formed without employing lithographic and etching techniques and these gratings may reduce the power losses of waves operated on by the gratings.

DETAILED DESCRIPTION OF THE INVENTION

The gratings of the present invention are spaced a distance apart which is dependent on their use. For example, in optical waveguide systems, gratings having elements spaced about 0.5 to 10 micrometers apart will function as beam splitters and waveguides. If the grating is to be employed as surface acoustice wave launchers, gratings having elements spaced about 1 to micrometers apart are utilized.

Figure 1:
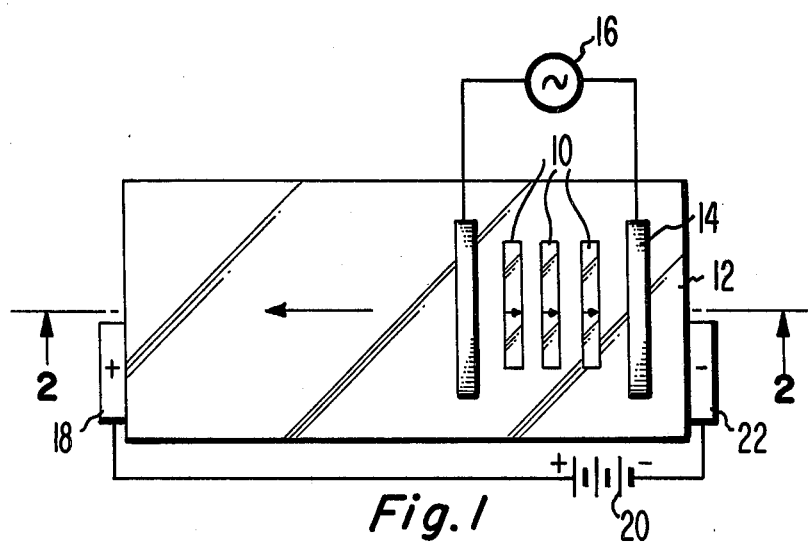
FIG. 1 is a top view schematic illustration of a surface acoustic wave device having a surface wave launcher.
Figure 2:
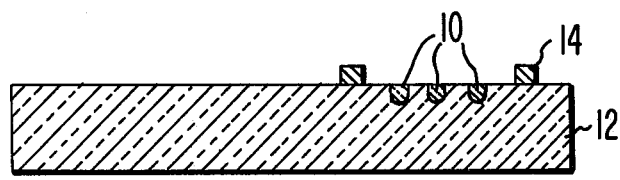
FIG. 2 is a cross-sectional schematic illustration of a surface acoustic wave device having a surface acoustic wave launcher.

In FIGS. 1 and 2 a grating 10 of the present invention which may be used in an acoustic wave launcher is shown on a single domain substrate 12 of lithium niobate. The arrow on the substrate 12 in FIG. 1 indicates the plus c-axis direction of the substrate. The c-axis of lithium niobate is the rotational axis of highest symmetry. The plus c-axis direction of the c-axis is the direction pointing towards the end of a single domain crystal which becomes positively charged during cooling due to the pyroelectric effect. The arrows in the gratings 10 indicate the plug c-axis direction of the grating. Positioned on the sides of the grating 10 are electrodes 14 which are connected to an electrical source 16. Electrical impulses to the electrodes 14 will result in surface acoustic waves being launched from the grating 10. It is believed that the power losses associated with the grating 10 of the present invention are lower than the power losses associated with conventional acoustic wave launching devices.

In order to form the domain structures of the present invention a metal is selected that, when diffused into the substrate, will lower the Curie temperature of the substrate. Suitable metals are transition metals such as cobalt and niobium. A grating pattern of metal is deposited onto the substrate using suitable techniques such as vacuum vapor deposition, wherein the vapors in a vacuum are transmitted through a mask and deposited onto the substrate. When gratings for acoustic systems are formed, the mask may be a metal mask. When finer gratings for optical systems are formed, the mask may also be metal or may be prepared using standard photolithographic techniques. The metal vapor deposition layer thicknesses are suitably from about 300 to 2000 angstroms and preferably from about 600 to 1000 angstroms.

The metal layer is then diffused into the substrate to a depth approximately equal to the grating spacing. The substrate must be heated in an oxidizing atmosphere to a temperature high enough to allow diffusion of the metal into the substrate, but below the Curie temperature of the substrate which is about 1150° C. Suitable temperatures are from about 1075° to 1105° C. The depth of diffusion is controlled by the time that the substrate remains at the diffusion temperature. For example, diffusion about 20 micrometers deep will occur after about 24 hours at a temperature of about 1095° C.

The plus c-axis of the regions of the lithium niobate substrate into which the metal is diffused is reversed by applying to the heated substrate an electrical potential. The electrical potential is suitably a D.C. voltage of about 0.2 to 1.0 volt per centimeter between the electrodes, producing a current of approximately 200 microamperes.

The temperature with electrical potential applied must remain below the Curie temperature of the substrate but be above the Curie temperature of the region of the substrate into which the metal has been diffused. When cobalt or niobium is employed, the Curie temperature of the diffused region is about 1075° C. The potential is applied by contacting two opposite sides of the substrate with the positive and negative pole of the electrical potential.

As shown in FIG. 1, the positive pole 18 of an electrical potential 20 is positioned on the face of the plus c-axis of the substrate 12 and the negative pole 22 of the electrical potential 20 is positioned on the face of the minus c-axis of the substrate 12.

The electrode may be applied directly to the sides of the substrate or a platinum paint may be applied to the sides of the substrate in order to increase the conductivity. With the electric field applied to the substrate, the substrate is cooled to below the Curie temperature of the regions with the diffused metal. The plus c-axis of the region of the substrate having the diffused metal is reversed forming a grating. The potential may then be removed.

In another embodiment of this invention a combination of cobalt and niobium is diffused into the substrate. A layer of cobalt is vacuum evaporated onto the substrate through a mask as described above. Niobium pentoxide is provided as a source of niobium, which may be niobium pentoxide coated on a substrate having its coated surface positioned approximately 5 millimeters above the evaporated cobalt layer. Both the niobium pentoxide source and the lithium niobate substrate are heated to a temperature of about 1075° C. to 1105° C. during the diffusion step which allows a combination of cobalt and niobium to diffuse into the lithium niobate substrate. The plus c-axis orientation of the diffused region is then reversed as described above.

I claim:

1. A wave device comprised of a single domain lithium niobate substrate having a grating in a surface thereof wherein the grating comprises single domain regions of lithium niobate having their plus c-axis direction substantially opposite the plug c-axis direction of the substrate.

2. A wave device according to claim 1 wherein the wave device is an optical wave device having grating elements spaced about 0.5 to 10 micrometers apart.

3. A wave device according to claim 1 wherein the wave device is a surface acoustic wave device having grating elements spaced about 1 to 100 micrometers apart.

4. A method for forming a grating on a single domain lithium niobate substrate which comprises:
   (a) depositing a metal layer in the form of a grating pattern on the substrate wherein the metal is one that will lower the Curie temperature of the substrate when diffused therein;
   (b) diffusing the metal layer into the substrate;
   (c) heating the substrate to a temperature below the Curie temperature of the substrate but above the Curie temperature of the diffused metal layer;
   (d) applying an electrical potential to the heated substrate with the positive pole of the potential contacting the plus c-axis face of the substrate and the negative pole of the potential contacting the negative c-axis face of the substrate; and
   (e) cooling the heated substrate below the Curie temperature of the diffused regions with the electrical potential applied thereby reversing the plus c-axis direction of the diffused regions.

5. A method according to claim 4 wherein the deposited metal layer is about 300 to 2000 angstroms thick.

6. A method according to claim 4 wherein the substrate is heated to a temperature of about 1075° C. to 1105° C.

7. A method according to claim 4 wherein the potential is about 0.2 to 1.0 volt per centimeter between said faces of the substrate, and the D. C. current is about 200 microamperes.

* * * * *